(12) United States Patent
Yoshikawa et al.

(10) Patent No.: US 8,737,042 B2
(45) Date of Patent: May 27, 2014

(54) TERMINAL BOX FOR USE WITH SOLAR CELL MODULE

(75) Inventors: Hiroyuki Yoshikawa, Yokkaichi (JP); Makoto Higashikozono, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 124 days.

(21) Appl. No.: 13/394,567

(22) PCT Filed: Oct. 19, 2010

(86) PCT No.: PCT/JP2010/068366
§ 371 (c)(1),
(2), (4) Date: Mar. 7, 2012

(87) PCT Pub. No.: WO2011/118068
PCT Pub. Date: Sep. 29, 2011

(65) Prior Publication Data
US 2013/0000972 A1    Jan. 3, 2013

(30) Foreign Application Priority Data

Mar. 23, 2010    (JP) ................................ 2010-066023

(51) Int. Cl.
*H05K 7/20*     (2006.01)
*H05K 5/02*     (2006.01)
*H01R 12/00*    (2006.01)
*H01L 31/048*   (2014.01)

(52) U.S. Cl.
CPC .............. *H05K 7/20* (2013.01); *H01L 31/0486* (2013.01); *H05K 5/02* (2013.01)
USPC ........... 361/641; 174/549; 361/704; 361/708; 439/76.1; 439/76.2

(58) Field of Classification Search
CPC ............ H01L 31/0485; H01L 31/0486; H01L 31/042; H01R 13/6641; H01R 9/2425; H05K 5/02; H05K 7/20
See application file for complete search history.

(56) References Cited

U.S. PATENT DOCUMENTS 7,369,398 B2 *  5/2008  Higashikozono et al. .... 361/641
7,920,385 B2 *  4/2011  Yoshikawa et al. ........... 361/752

(Continued)

FOREIGN PATENT DOCUMENTS

| DE | 10 2007 006 900 | 10/2007 |
|---|---|---|
| JP | 2001-298206 | 10/2001 |
| JP | 3498945 | 12/2003 |
| JP | 2005-310888 | 11/2005 |
| JP | 2005-332869 | 12/2005 |
| WO | 2008/124951 | 10/2008 |
| WO | 2010/137188 | 12/2010 |

OTHER PUBLICATIONS

International Preliminary Report on Patentability, Jan. 18, 2011.

*Primary Examiner* — Gregory Thompson
(74) *Attorney, Agent, or Firm* — Gerald E. Hespos; Michael J. Porco; Matthew T. Hespos

(57) ABSTRACT

Provided is a terminal box for a solar cell module that has excellent heat radiation. The terminal box (10) is provided with multiple terminal boards (21), a reverse load bypass diode (22) that is connected to two corresponding terminal boards (21), a primary resin layer (23) that is attached to the diode (22) and covers the area around the diode (22), and a secondary resin layer (41) that is made from a resin different to that of the primary resin layer (23) and is adhered to parts other than the diode (22) and does not cover the area around the diode (22).

9 Claims, 7 Drawing Sheets

(56) References Cited

U.S. PATENT DOCUMENTS

| | | |
|---|---|---|
| 8,547,685 B2 * | 10/2013 | Yoshikawa et al. ........... 361/641 |
| 2005/0230140 A1 | 10/2005 | Higashikozono et al. |
| 2005/0236031 A1 * | 10/2005 | Higashikozono et al. .... 136/251 |
| 2005/0268958 A1 | 12/2005 | Aoyama |
| 2006/0049802 A1 * | 3/2006 | Higashikozono et al. .... 320/134 |
| 2010/0151725 A1 | 6/2010 | Grimberg et al. |
| 2010/0170715 A1 | 7/2010 | Grimberg et al. |
| 2012/0057304 A1 * | 3/2012 | Yoshikawa et al. ........... 361/707 |

* cited by examiner

TERMINAL BOX FOR USE WITH SOLAR CELL MODULE

BACKGROUND OF THE INVENTION

1. Field of the Invention

The present invention relates to a terminal box for use with solar cell module.

2. Description of the Related Art

Japanese Patent No. 3498945 discloses a conventional terminal box for use with a solar cell module. The disclosed terminal box comprises a plurality of terminal boards, bypass diodes for reverse load, each of which diodes is connected to two terminal boards, and a housing which houses the diodes and the terminal boards. The housing is filled with silicon resin after the terminal boards and the diodes have been housed. A cover is attached to the housing after the silicon resin has been cured.

In the above-described terminal box, heat generated by the diodes is adapted to be released into the atmosphere after transfer through the silicon resin and the cover. However, since each diode is doubly resin-sealed by the silicon resin and the cover, there is a problem that the heat easily tends to stay within the silicon resin. As a result, heat is not sufficiently dissipated from the housing, and in the worst case, there is a possibility of trouble with a rectifying function of the diodes.

The present invention was made in view of the foregoing circumstances and an object thereof is to provide a terminal box for use with a solar cell module having a beneficial effect on the heat radiation performance.

SUMMARY OF THE INVENTION

The present invention is a terminal box for use with a solar cell module, which is mounted on a solar panel, comprising a plurality of terminal boards, a bypass diode for reverse load connected to each pair of terminal boards, a primary resin layer which covers a periphery of the diode and is caused to adhere to the diode, and a secondary resin layer comprising a resin differing from the primary resin layer and not covering the periphery of the diode, wherein the primary resin layer has a higher heat resistance than the secondary resin layer and an expansion coefficient nearer to an expansion coefficient of the diode than the secondary resin layer.

The primary resin layer covers the periphery of the diode, and the secondary resin layer does not cover the periphery of the diode. Accordingly, heat generated by the diode is released through the primary resin layer into an atmosphere. Thus, since the resin layer is not reduplicated as a heat releasing path to the atmosphere, it is difficult for heat to stay within the housing, whereby the terminal box has an advantage in the radiation performance. Furthermore, a function the primary resin layer cannot cover can be complemented by the secondary resin layer. Furthermore, a function the primary resin layer cannot cover can be complemented by the secondary resin layer. Furthermore, since the primary resin layer has a higher heat resistance than the secondary resin layer and an expansion efficiency nearer to that of the diode than the secondary resin layer, the diode can radiate heat and the load applied to the diode by the thermal expansion can be reduced even when the temperature of the diode rises high. On the other hand, the secondary resin layer which does not strongly necessitate such a property can be made of a material less expensive than that of the primary resin layer.

The following configurations may be added to the terminal box for use with the solar cell module according to the invention:

The primary resin layer covering the periphery of the diode is exposed to the atmosphere. Consequently, heat generated by the diode is quickly released from the primary resin layer into the atmosphere.

The primary resin layer has an adhered portion having a convex shape following an outline of the diode. Since such an adhered portion has a small thickness, the heat generated by the diode is quickly released from the primary resin layer into the atmosphere.

The diode comprises a bare chip which has a rectification function and is supported on one of the two terminal boards and a conductor strip connected between the bare chip and the other terminal board. Since the diode is not resin-packaged, heat generated by the diode transfers directly to the primary resin layer, whereupon the terminal box is advantageous in the heat radiation performance.

The primary resin layer contains glass fiber. Consequently, the strength of the primary resin layer can be improved.

The secondary resin layer comprises a resin having a higher weather resistance as compared with the primary resin layer. Consequently, progress of deterioration of the secondary resin layer can be suppressed even when the secondary resin layer is exposed to the atmosphere.

Each terminal board has a lead connecting portion to which a lead from the solar panel is connected. The lead connecting portion is disposed so as to face an opening of a cylindrical surrounding portion that is constituted only by the secondary resin layer. Consequently, the periphery of the lead connecting portion having a low degree of necessity of heat radiation is surrounded by the secondary resin layer, whereas the diode having a higher degree of necessity of heat radiation is covered by the primary resin layer. Accordingly, the first and secondary resin layers are suitably allocated to respective necessary portions.

A seal material comprising an insulating resin is introduced into the surrounding portion to be cured after connection of the lead to the lead connecting portion. Since the seal material is not introduced into the diode side even though introduced into the surrounding portion, an amount of the seal material to be introduced can be reduced.

After the seal material comprising the insulating resin has been introduced into the surrounding portion to be cured, the cover is fitted into the opening end of the surrounding portion, whereby the surrounding portion is capped. The cover can be rendered more compact since it is fitted into the surrounding portion but not into the diode side.

DETAILED DESCRIPTION OF THE PREFERRED EMBODIMENTS

Figure 1:
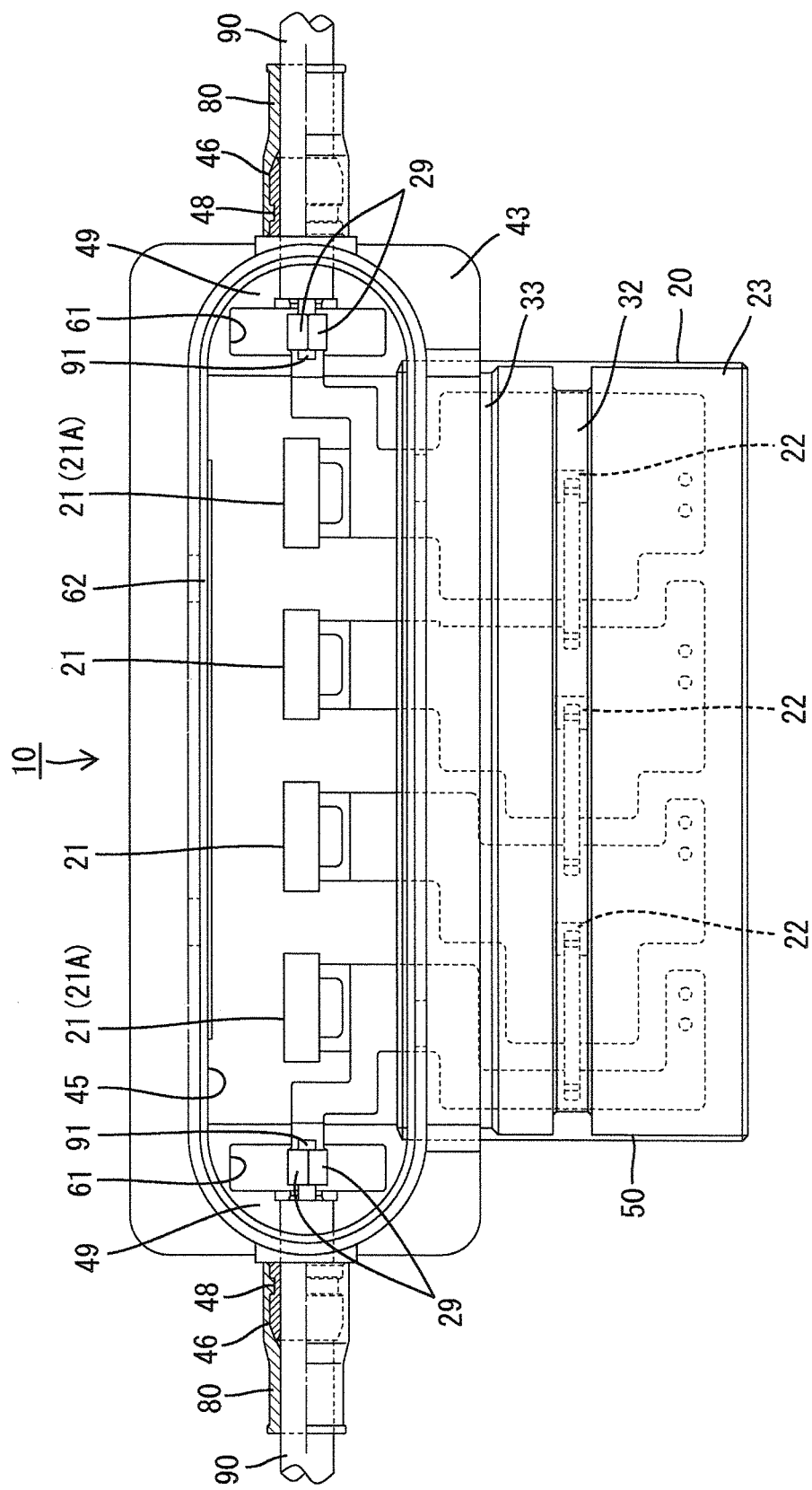
FIG. 1 is a plan view of a terminal box for use with a solar cell module to which a cable is connected, according to the present invention.

An embodiment of the present invention will be described with reference to FIGS. 1 to 7. A terminal box for use with a solar cell module (hereinafter, "terminal box 10") is to be mounted on the underside of a solar panel 100 (see FIG. 7) provided with a multitude of serially interconnected solar cells. The terminal box 10 includes a plurality of terminal boards 21, bypass diodes 22 for reverse load, each of which is connected between the terminal boards 21, and a primary resin layer 23 covering peripheries of the terminal boards 21 and the diodes 22. The terminal box 10 is primarily formed into a diode module 20 as an intermediate product and subsequently secondarily formed thereby to be completed.

Figure 2:
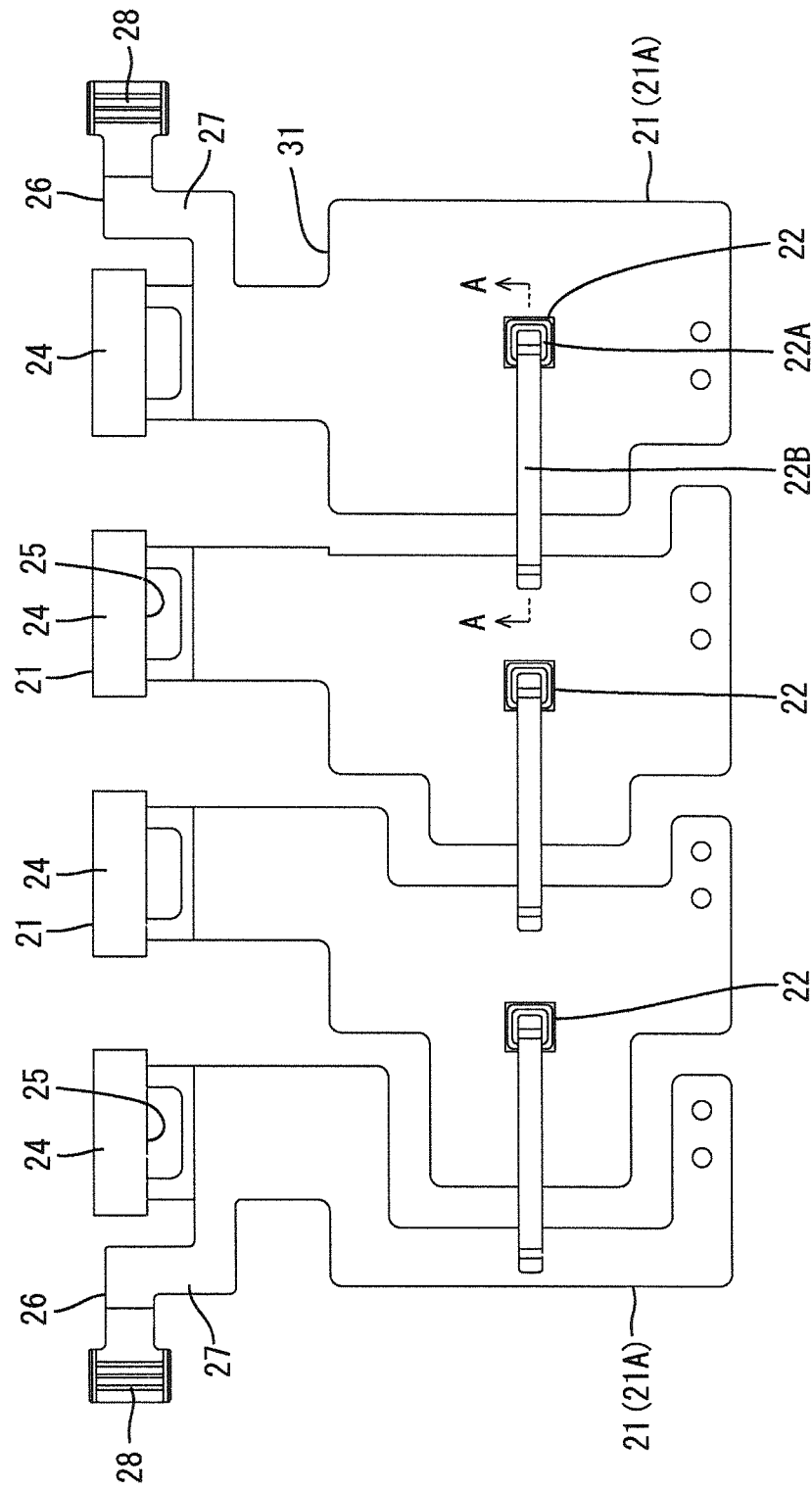
FIG. 2 is a plan view of a diode module before the terminal boards are covered with the resin portion.

Each terminal board 21 is formed into the shape of a strip by the cutting or the like of an electrically conductive metal plate. Four terminal boards 21 are juxtaposed widthwise as shown in FIG. 2. Each terminal board 21 has a front end formed with a lead connecting portion 24 to which a lead (not shown) extending from a solar cell group is connected by soldering. Each lead connecting portion 24 is formed with a horizontally long connecting hole 25 which has an opening and into which a lead is to be inserted.

Two terminal boards 21 located at both widthwise ends serve as cable connecting terminals 21A to which are connected positive side and negative side cables 90 for taking an electromotive force out of the solar cell groups, respectively. A pair of cable connecting portions 26 are formed on front ends of the cable connecting portions 21A so as to be located adjacent to the lead connecting portions 24. The cable connecting portions 26 protrude outward from the widthwise ends of the cable connecting terminals 21A respectively. The cable connecting portions 26 have middle portions formed with bent portions 27 which are shifted forward into a stepped shape, respectively. Furthermore, the cable connecting portions 26 have distal ends formed with open barrel-shaped barrel portions 28 respectively. Each barrel portion 28 has a pair of barrel strips 29 which are formed so as to rise upward (see FIG. 6). Both barrel strips 29 are wound onto a core wire 91 on a terminal of a cable 90 such that the cable connecting terminal 21A is crimped onto the cable 90 for connection.

Each diode 22 comprises a flat bare chip 22A, a metal plate-like conductor strip 22B connected to the bare chip 22A. Each diode 22 is not packaged by the resin. Each bare chip 22A is formed by stacking a P side region (anode region) and an N side region (cathode region) and is placed directly on a substantially widthwise middle of the surface of the terminal board 21. Each bare chip 22A has a bottom connected to the surface of the terminal board 21 by soldering. In the embodiment, the bare chips 22A are adapted to be supported on the right-sided three of the four terminal boards 21 respectively as shown in FIG. 2.

Figure 3:
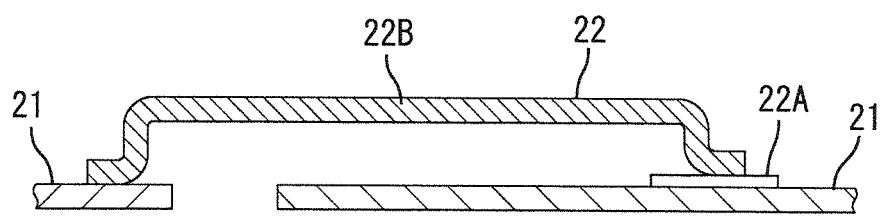
FIG. 3 is a sectional view taken along line A-A in FIG. 2.

Each conductor strip 22B is widthwise elongated from one end to the other end as shown in FIG. 3. One of two widthwise ends of each conductor strip 22B is connected to a ceiling (having a polarity differing from the bottom of the bare chip 22A) of the bare chip 22A by soldering. The other widthwise end of each conductor strip 22B is connected, by soldering, to the terminal board 21 adjacent to the terminal board 21 supporting the bare chip 22A. Thus, each conductor strip 22B is connected between the terminal boards 21 adjacent to each other such that three conductor strips 22B are disposed so as to correspond to the four terminal boards 21.

Each terminal board 21 has a function of a radiator plate which releases heat generated by the corresponding bare chip 22A. Each terminal board 21 has a stepped portion 31 formed between a part thereof supporting the bare chip 22A and another part thereof having the lead connecting portion 24 and the cable connecting portion 26. Each terminal board 21 has a part on which the bare chip 22A is supported and which includes the stepped portion 31 as a boundary. The part of each terminal board 21 has an enlarged radiation surface area, although the leftmost cable connecting terminal 21A supporting no bare chip 22A has a smaller area than the other terminal boards 21 for a lower degree of necessity for heat radiation, as viewed in FIG. 2. As a result, the space efficiency is adapted to be improved.

Figure 4:
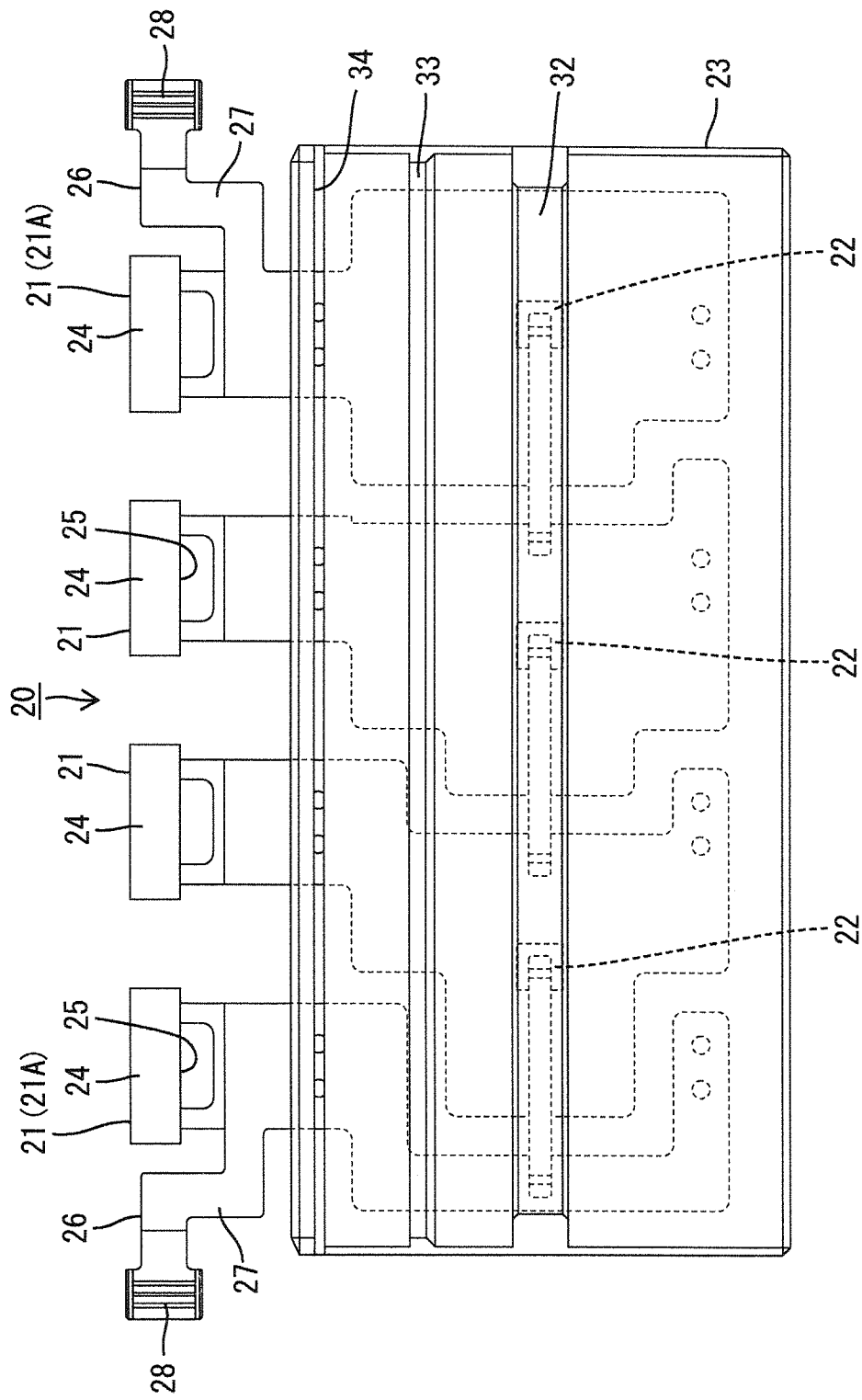
FIG. 4 is a plan view of the diode module.

The diode module 20 includes not only the foregoing terminal boards 21 and the diodes 22 but also a primary resin layer 23 which is molded so as to cover peripheries of the diodes 22, as shown in FIG. 4. In other words, the diodes 22 are resin-packaged by the primary resin layer 23 together with the terminal boards 21.

The primary resin layer 23 is not formed on the front ends of the respective terminal boards 21 and is thus adhered to the whole of each terminal board 21 except for the front end of each terminal board 21. As a result, the diode module 20 is disposed while the lead connecting portion 24 and the cable connecting portion 26 are exposed. The primary resin layer 23 is formed into the shape of a rectangular flat mat and thinly adhered to both upper surfaces and the undersides of the respective terminal boards 21 from portions immediately before the respective stepped portions 31 to the respective rearward portions of the terminal boards 21. The primary resin layer 23 serves to maintain predetermined spaces among the terminal boards 21 and to avoid stress acting between the terminal boards 21 and the diodes 22 respectively and to provide an insulating coating for the terminal boards 21 and the diodes 22.

The primary resin layer 23 is disposed so that the surface thereof is exposed to the atmosphere. The surface of the primary resin layer 23 is formed with an adhered portion 32 having a convex shape following an outer configuration of the diode 22. The adhered portion 32 linearly extends substantially over an entire width generally in a middle part of the primary resin layer 23 in the front-back direction. The primary resin layer 23 including the adhered portion 32 has a thickness that is substantially constant from the surface of the terminal board 21 to the surface of the diode 22 (see FIG. 6).

Furthermore, a claw-like protrusion 33 is formed on the surface of the primary resin layer 23 so as to be located ahead of the adhered portion 32. The protrusion 33 is formed so as to extend straightforward over an entire width of the primary resin layer 23. A horizontally long slit-like concave groove 34 is further formed on a front end of the primary resin layer 23 so as to be located ahead of the protrusion 33. The concave groove 34 is formed so as to extend straightforward over an entire width of the primary resin layer 23. The surface of each terminal board 21 is exposed through the concave groove 34.

The primary resin layer 23 is made of a thermoplastic resin with a high heat resistance, such as polyphenylene sulfide (hereinafter, "PPS"). Furthermore, the primary resin layer 23 contains glass fiber, which realizes an improvement in the heat resistance.

The terminal box 10 will now be described and comprises a surrounding portion 42 further comprising a secondary resin layer 41 in addition to the above-described diode module 20. The surrounding portion 42 comprises a flat plate-shaped connecting portion 43 connected integrally to the front end of the primary resin layer 23 and a cylindrical portion 44 which rises so as to surround the peripheries of the lead connecting portions 24 and both cable connecting portions 26 ahead of the connecting portion 43. More specifically, the secondary resin layer 41 does not cover the peripheries of the diodes 22 and composes the front end of the terminal box 10. In the embodiment, a resin portion 50 is constituted by the primary and secondary resin layers 23 and 41.

Figure 6:
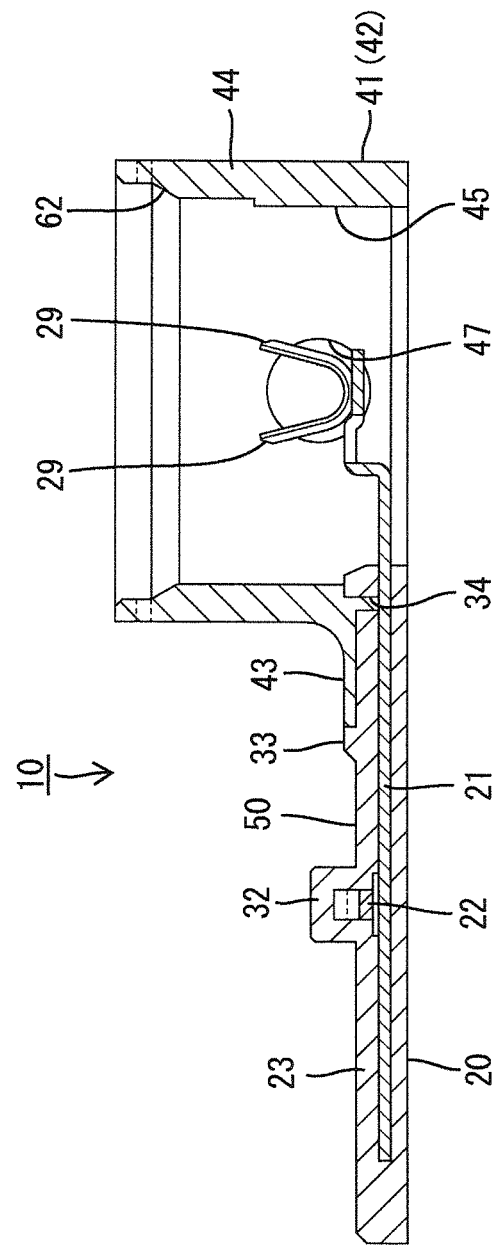
FIG. 6 is a sectional view taken along line B-B in FIG. 5.

The connecting portion 43 is thinly adhered to the front end of the primary resin layer 23 and has a rear end adherent closely to the protrusion 33 and a surface thereof located substantially at the same level as a protruding end of the protrusion 33, as shown in FIG. 6. The protrusion 33 is adapted to keep back molten resin during the forming of the secondary resin layer 41.

The secondary resin layer 41 is made of polyphenylene ether (hereinafter, "PPE") and the like and thus constituted by a thermoplastic resin that has a higher weather resistance and mechanical property than the primary resin layer 23. The secondary resin layer 41 contains no glass fiber. The PPS constituting the primary resin layer 23 has a linear expansion coefficient that is smaller than the PPE constituting the secondary resin layer 41 and closer to a metal constituting each terminal board 21 and the conductor strip 22B of each diode 22, such as a copper alloy.

The cylindrical portion 44 has a laterally oval opening 45 that exceeds an overall width of the diode module 20, and each lead connecting portion 24 and both cable connecting portions 26 are disposed so as to face an interior of the opening 45. The cylindrical portion 44 has a rear root portion located in the concave groove 34, whereby the second resin layer 41 is adherent closely to the primary resin layer 23.

Figure 5:
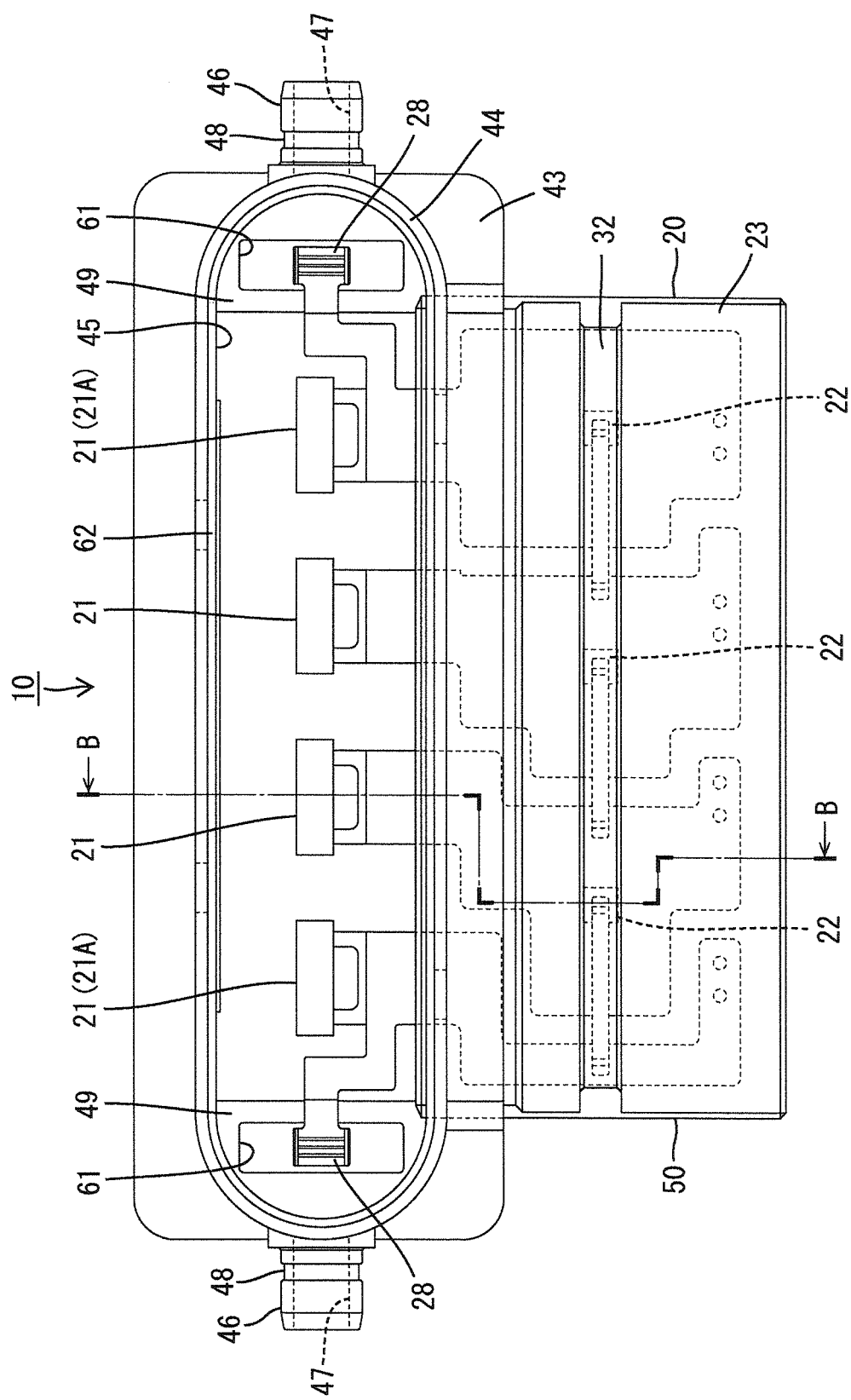
FIG. 5 is a plan view of the terminal box for use with the solar cell module.

The cylindrical portion 44 has both widthwise ends having outer surfaces formed with cylindrical cable insertion portions 46 which are formed so as to protrude, respectively, as shown in FIG. 5. The cable insertion portions 46 have insertion holes 47 which are formed so as to widthwise extend therethrough and into which cables 90 are to be inserted, respectively. The cables 90 are adapted to be drawn out of the insertion holes 47 widthwise outside both ends of the cylindrical portion 44 respectively. Furthermore, the cable insertion portions 46 have outer circumferential surfaces formed with annular grooves 48 which are formed so as to extend the entire circumferences, respectively. Rubber plugs 80 are adapted to be fitted with the cable insertion portions 46 (see FIG. 1) respectively. The rubber plugs 80 are adapted to close gaps between the insertion holes 47 and the cables 90 thereby to serve to prevent water invasion into the cylindrical portion 44 respectively.

The opening 45 of the cylindrical portion 44 has bottom faces which are located at both widthwise ends and closed by closing plates 49 respectively. The barrels 28 of both cable connecting terminals 21A are placed on the closing plates 49 respectively. The closing plates 49 are formed with jig holes 61 which are open at positions corresponding to the barrels 28, respectively. The opening 45 of the cylindrical portion 44 has an upper end formed with a stepped receiving portion 62 extending over the entire circumference. The receiving portion 62 is capable of supporting a peripheral edge of a cover (not shown).

The following will describe a method of manufacturing the diode module 20 and the terminal box 10 according to the embodiment, and the like. Firstly, the diodes 22 are connected to the terminal boards 21 by soldering (see FIG. 2). In this case, it is desirable that the terminal boards 21 be integrally connected by carriers in order that an excessive amount of stress may not act on connections of the terminal boards 21 and the diodes 22. These carriers can be cut off after the molding of the primary resin layer 23.

Subsequently, an integrated combination of the terminal boards 21 and the diodes 22 is set in a die (not shown) for a primary molding and molten resin is injected into the die. As a result, the molten resin is thinly adhered to the peripheries of the diodes 22 and portions of the terminal boards 21 except for lead connecting portions 24 and the cable connecting portions 26, whereby the primary resin layer 23 is formed after the curing of the molten resin. The diode module 20 is thus manufactured (see FIG. 4).

The diode module 20 is subsequently set in a die (not shown) for a secondary molding, and molten resin is injected into the die. After the molten resin has been cured, the surrounding portion 42 serving as the secondary resin layer 41 is formed integrally with a front end of the primary resin layer 23 so as to surround the peripheries of the lead connecting portion 24 and the cable connecting portion 26. The terminal box 10 is thus manufactured (see FIGS. 5 and 6).

Subsequently, the cables 90 are inserted into the insertion holes 47 of the cable insertion portions 46 from the outsides of both ends of the terminal box 10. A crimp jig (not shown) is inserted into each jig hole 61 from below while the core wire 91 of the cable 90 is supported on the barrel portion 28. The crimp jig is operated so that a bending work is applied to the barrel strip 29, whereby the cable 90 is connected to the cable connecting portion 26. A rubber plug 80 which has been attached around the cable 90 is moved up to the cable insertion portion 46 side to be fitted around the outer periphery of the cable insertion portion 46 (see FIG. 1). In this case, an inner circumferential part of the rubber plug 80 enters into the annular groove 48 of the cable insertion portion 46 such that the adherence of the rubber plug 80 to the cable insertion portion 46 can be improved.

Subsequently, the bottom of the terminal box 10 is mounted to the underside of the solar panel 100 by adhesive or the like. In the course of the mounting, the lead is drawn into the opening 45 of the cylindrical portion 44 so that a distal end of the lead is connected through the connecting hole 25 to the lead connecting portion 24 of the corresponding terminal board 21 by soldering. A seal material comprising an insulating resin such as silicon resin is subsequently introduced into the cylindrical portion 44 to fill the interior of the cylindrical portion 44. After the seal material has been cured, a cover is fitted onto the receiving portion 62 so that the cylindrical portion 44 is capped. The mounting of the terminal box 10 to the solar panel 100 is thus completed.

Figure 7:
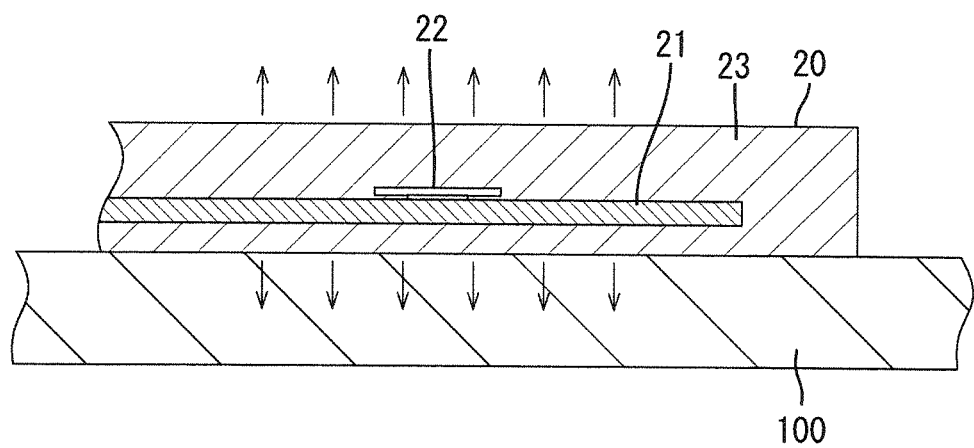
FIG. 7 is a conceptual scheme for explaining a heat radiation path for the diode.

Since each diode 22 heats up to a high temperature during use of the terminal box, damage due to self-heating would disable the rectification function of each diode 22. In the embodiment, however, heat generated by each diode 22 is quickly released via the corresponding terminal board 21 from the bottom of the primary resin layer 23 to the solar panel 100 side and also quickly released from the ceiling of the primary resin layer 23 to the atmosphere side, as schematically shown in FIG. 7. This can avoid heat from staying in the interior of the diode module 20 (the terminal box 10). Moreover, since the adhered portion 32 is adhered to the periphery of each diode 22 and has an outer shape following the outline of each diode 22, the thickness of the adhered portion 32 can be limited to a small value and the radiation performance can dramatically be improved.

Furthermore, since the lead connecting portions 24 and the cable connecting portions 26 are disposed in the diode module 20 so as to be exposed, the leads and the cables 90 can smoothly be connected.

Furthermore, the terminal boards 21 are juxtaposed and the cable connecting portions 26 are formed integrally with the terminal boards 21 so as to be adjacent to the lead connecting portions 24 of the cable connecting terminals 21A located at both ends of the juxtaposition in the direction of juxtaposition respectively. Accordingly, the diode module 20 is divided into a region molded from the primary resin layer 23 and a region having the lead connecting portions 24 and the cable connecting portions 26. This results in higher moldability.

Furthermore, since each terminal board 21 is an injection-molded article integrated with the primary resin layer 23 by the insert molding, the molding can be rendered easier and an amount of resin adhered to each terminal board 21 can be adjusted to a small amount.

Furthermore, the terminal box 10 can easily be manufactured from the diode module 20 since the cylindrical surrounding portion 42 is formed on the distal end of the diode module 20 in postforming.

Furthermore, since the insulating seal material is introduced into the opening 45 of the cylindrical portion 44 and the cover is attached to the cylindrical portion 44 so as to cover the seal material, an amount of the seal material can be limited to a small amount to be supplied only into the interior of the cylindrical portion 44.

According to the embodiment, furthermore, since the resin portion 50 has the secondary resin layer 41 aside from the primary resin layer 23, a function the primary resin layer 23 cannot cover can be complemented by the secondary resin layer 41.

Furthermore, since each diode 22 comprises the bare chip 22A and the conductor strip 22B and is not packaged by the use of resin, heat generated by each diode 22 is transferred directly to the primary resin layer 23, whereupon the terminal box 10 has further advantage in the radiation performance.

Furthermore, since the primary resin layer 23 has a higher heat resistance and an expansion efficiency nearer to that of the diode 22 as compared with the second resin layer 41, heat can be radiated even when the temperature of each diode 22 rises high, and the load applied to each diode 22 by the thermal expansion can be reduced. On the other hand, the secondary resin layer 41 which does not strongly necessitate such a property can be made of a material less expensive than that of the primary resin layer 23.

Furthermore, each terminal board 21 has a lead connecting portion 24 which is disposed so as to face the opening 45 of the cylindrical portion 44, and the surrounding portion 42 including the cylindrical portion 44 is constituted only by the secondary resin layer 41. Accordingly, the periphery of the lead connecting portion 24 having a low degree of necessity of heat radiation is surrounded by the secondary resin layer 41, whereas the diode 22 having a higher degree of necessity of heat radiation is covered by the primary resin layer 23. Consequently, the first and secondary resin layers 23 and 41 are suitably allocated to respective necessary portions.

The invention should not be limited to the embodiment described above with reference to the accompanied drawings, and the following embodiments may be included in the technical scope of the invention:

The resin portion may be configured to be adhered only to the periphery of each diode.

Each cable connecting portion may be formed at a rear end of the cable connecting terminal, which rear end is located opposite the side where the lead connecting portion is formed.

A thermosetting resin such as epoxy resin or unsaturated polyester resin may be used instead of PPS.

A diode package comprising a resin-packaged bare chip and a conductor strip may be used as the diodes.

Each terminal board may be constituted by two cable connecting terminals, and a single diode may be connected between the cable connecting terminals, instead.

The invention claimed is:

1. A terminal box for use with a solar cell module, which is mounted on a solar panel, comprising:
   a plurality of terminal boards;
   a bypass diode for reverse load connected to each pair of terminal boards;
   a primary resin layer which covers a periphery of the diode and is caused to adhere to the diode; and
   a secondary resin layer comprising a resin differing from the primary resin layer and not covering the periphery of the diode, wherein the primary resin layer has a higher heat resistance than the secondary resin layer and an expansion coefficient nearer to an expansion coefficient of the diode than the secondary resin layer.

2. The terminal box according to claim 1, wherein the primary resin layer covering the periphery of the diode is exposed to an atmosphere.

3. The terminal box according to claim 2, wherein the primary resin layer has an adhered portion having a convex shape according to an outline of the diode.

4. The terminal box according to claim 1, wherein the diode includes a bare chip which has a rectification function and is supported by one of the terminal boards and a conductor strip connected between the bare chip and the other terminal board.

5. The terminal box according to claim 1, wherein the primary resin layer contains glass fiber.

6. The terminal box according to claim 1, wherein the secondary resin layer is made of a resin having a higher weather resistance than the primary resin layer.

7. The terminal box according to claim 1, wherein each terminal board has a lead connecting portion to which a lead from the solar panel is connected, and the lead connecting portion is disposed so as to face an opening interior of a cylindrical surrounding portion constituted only by the secondary resin layer.

8. The terminal box according to claim 7, wherein after the lead has been connected to the lead connecting portion, a seal material comprising an insulating resin is introduced into the surrounding portion to be cured.

9. The terminal box according to claim 8, wherein a cover is fitted into an opening end of the surrounding portion thereby to cap the surrounding portion after the seal material comprising the insulating resin has been introduced into the surrounding portion to be cured.

* * * * *